United States Patent
Lee et al.

(10) Patent No.: US 8,801,485 B2
(45) Date of Patent: Aug. 12, 2014

(54) FRIT SEALING SYSTEM AND METHOD OF MANUFACTURING ORGANIC LIGHT-EMITTING DISPLAY (OLED) APPARATUS USING THE SAME

(71) Applicant: Samsung Display Co., Ltd., Yongin (KR)

(72) Inventors: Jung-Min Lee, Yongin (KR); Choong-Ho Lee, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/047,897

(22) Filed: Oct. 7, 2013

(65) Prior Publication Data

US 2014/0038327 A1 Feb. 6, 2014

Related U.S. Application Data

(62) Division of application No. 12/964,641, filed on Dec. 9, 2010, now Pat. No. 8,556,671.

(30) Foreign Application Priority Data

Dec. 10, 2009 (KR) ........................ 10-2009-0122534

(51) Int. Cl.
 *H01J 9/00* (2006.01)
(52) U.S. Cl.
 USPC ............................................. 445/23; 445/25
(58) Field of Classification Search
 USPC .................................................... 445/22–25
 See application file for complete search history.

(56) References Cited

U.S. PATENT DOCUMENTS

| | | |
|---|---|---|
| 2003/0066311 A1 | 4/2003 | Li et al. |
| 2007/0182314 A1 | 8/2007 | Oh et al. |
| 2007/0194304 A1 | 8/2007 | Zu et al. |
| 2007/0195634 A1 | 8/2007 | Lee et al. |
| 2009/0229745 A1 | 9/2009 | Lee et al. |
| 2009/0233514 A1 | 9/2009 | Lee et al. |

FOREIGN PATENT DOCUMENTS

| | | |
|---|---|---|
| JP | 2002-373583 A | 12/2002 |
| JP | 2003-123966 A | 4/2003 |
| JP | 3676748 B2 | 7/2005 |
| JP | 2007-115491 A | 5/2007 |
| KR | 10-0682963 B1 | 2/2007 |
| KR | 10-2008-0024345 A | 3/2008 |
| KR | 10-2009-0098187 A | 9/2009 |
| KR | 10-2009-0099222 A | 9/2009 |

OTHER PUBLICATIONS

Korean Registration Determination Certificate dated Mar. 28, 2011 for Korean Patent Application No. KR 10-2009-0122534 which corresponds to U.S. Appl. No. 12/964,641, filed Dec. 9, 2010, which is the parent of captioned U.S. Appl. No. 14/047,897.

*Primary Examiner* — Joseph L Williams
(74) *Attorney, Agent, or Firm* — Knobbe, Martens, Olson & Bear, LLP

(57) ABSTRACT

A frit sealing system and a method of manufacturing an organic light-emitting display (OLED) using the frit sealing system are disclosed. In one embodiment, the frit sealing system includes: a thermal expansion film formed on the second substrate to pressurize the second substrate when heat is applied to the frit and thermal expansion film, wherein the frit is interposed between the first and second substrates and a mask formed on the thermal expansion film.

5 Claims, 4 Drawing Sheets

FRIT SEALING SYSTEM AND METHOD OF MANUFACTURING ORGANIC LIGHT-EMITTING DISPLAY (OLED) APPARATUS USING THE SAME

CROSS-REFERENCE TO RELATED PATENT APPLICATION

This application is a divisional application of U.S. application Ser. No. 12/964,641 filed on Dec. 9, 2010, which is incorporated by reference in its entirety. application Ser. No. 12/964,641 claimed the benefit of Korean Patent Application No. 10-2009-0122534 filed in the Korean Intellectual Property Office on Dec. 10, 2009, the disclosure of which is hereby incorporated herein by reference in its entirety.

BACKGROUND

1. Field

The disclosed technology relates to a frit sealing system and a method of manufacturing an organic light-emitting display (OLED) using the same.

2. Description of the Related Technology

Many modern displays use thin film technology to make a type flat panel display (FPD). Among FPDS, an electroluminescent display apparatus is self-emissive, and has a wide viewing angle, a high-quality contrast, and a fast response time. Thus, the electroluminescent display has attracted attention as a next generation display. Also, an organic light-emitting display (OLED), including organic light-emitting layers, has enhanced luminance, driving voltage, and response time. The OLED apparatus has also a polychromatic characteristic in comparison with an inorganic light-emitting display (ILED).

SUMMARY OF CERTAIN INVENTIVE ASPECTS

One aspect of the present invention is a frit sealing system for improving an adhesive strength of a frit and a method of manufacturing an organic light-emitting display (OLED) using the frit sealing system.

Another aspect is a frit sealing system which includes a thermal expansion film expanding when a laser is radiated on a frit to pressurize first and second substrates and bond the first and second substrates to each other, in order to improve an adhesive strength of the frit and a method of manufacturing an OLED using the same.

Another aspect is a frit sealing system for bonding first and second substrates to each other using a frit, including: a laser radiator which radiates a laser on the frit coated between the first and second substrates; a thermal expansion film which is formed on the second substrate to pressurize the second substrate when the laser radiator radiates the laser on the frit; and a mask which is disposed on the thermal expansion film.

An area of the thermal expansion film on which the laser is radiated may expand locally.

The thermal expansion film may be patterned such that the thermal expansion film is not formed in an area on which the frit is coated.

The mask may include a base which is formed of a transparent material and a metal layer which is formed on a surface of the base.

The metal layer may be patterned to correspond to a movement path of the laser radiator.

A portion of the laser radiated toward the second substrate may melt the frit, and an other portion of the laser may expand an area of the thermal expansion film around the frit.

The other portion of the laser may heat the metal layer of the mask, and the heated metal layer may expand the thermal expansion film.

The thermal expansion film may include polymer or elastomer having a relatively high thermal expansion coefficient.

The frit sealing system may further include a pressurizer which pressurizes the mask in order to keep a fixed position of the mask when the thermal expansion film expands.

The laser radiator may move along a trajectory corresponding to a closed curve to radiate the laser on the frit which is disposed on a surface of the first substrate in the closed curve, in order to heat the frit and expand an area of the thermal expansion film on which the laser is radiated.

The first substrate may include a pixel area in which at least one OELD (organic electroluminescent device) including a first electrode, an organic layer, and a second electrode is formed and a non-pixel area which is formed outside the pixel area. The second substrate may be bonded to an area of the first substrate including the pixel area. The frit may be coated on an area of the non-pixel area between the first and second substrates.

Another aspect is a method of manufacturing an organic light-emitting display (OLED) apparatus using a frit sealing system bonding first and second substrates to each other using a frit, including: coating and melting the frit on one of the first and second substrates; disposing the second substrate on the first substrate; sequentially disposing a thermal expansion film and a mask on the second substrate; and radiating a laser on the second substrate to harden the frit and expand the thermal expansion film in order to pressurize the second substrate.

An area of the thermal expansion film on which the laser is radiated may expand locally.

The radiation of the laser on the second substrate may include: leading a portion of the laser radiated toward the second substrate to melt the frit; and leading an other portion of the laser to expand the thermal expansion film around the frit.

The mask may include a base formed of a transparent material and a metal layer formed on a surface of the base. The leading of the other portion of the laser to expand the thermal expansion film may include leading the other portion of the laser to heat the metal layer of the mask and leading the heated metal layer to expand the thermal expansion film.

The radiation of the laser on the second substrate may further include pressurizing the mask to keep a fixed position of the mask when the thermal expansion film expands.

Another aspect is a frit sealing system for bonding first and second substrates to each other using a frit, comprising: a thermal expansion film formed on the second substrate to pressurize the second substrate when heat is applied to the frit and thermal expansion film, wherein the frit is interposed between the first and second substrates; and a mask formed on the thermal expansion film.

In the above system, at least part of an area of the thermal expansion film to which the heat is applied expands. In the above system, a plurality of openings are formed in the thermal expansion film, and wherein the openings are formed substantially directly above the frit. The above system further comprises a laser radiator configured to apply a laser beam to the frit through the mask, the thermal expansion film and the second substrate. In the above system, the mask comprises i) a base which is formed of a transparent material and ii) a metal layer which is formed on a surface of the base. In the above system, a plurality of openings are formed in the metal layer along a movement path of the laser radiator. In the above system, the laser radiator is configured to melt the frit and expand an area of the thermal expansion film around the frit.

In the above system, the laser radiator is configured to heat the metal layer of the mask, and wherein the heated metal layer is configured to expand the thermal expansion film. In the above system, the laser radiator is configured to move along a trajectory corresponding to a closed curve and radiate the laser on the frit which is formed on a surface of the first substrate in the closed curve, in order to heat the frit and expand an area of the thermal expansion film on which the laser is radiated. In the above system, the thermal expansion film is formed of at least one of polymer and elastomer having relatively high thermal expansion coefficients. The above system further comprises a pressurizer configured to pressurize the mask in order to prevent the mask from moving when the thermal expansion film expands.

In the above system, the first substrate comprises i) a pixel area and ii) a non-pixel area which is formed outside the pixel area, wherein the pixel area comprises at least one organic electroluminescent device which includes a first electrode, an organic layer, and a second electrode is formed, wherein the second substrate is bonded to an area of the first substrate comprising the pixel area, and wherein the frit is formed on the non-pixel area between the first and second substrates.

Another aspect is a method of manufacturing an organic light emitting display apparatus using a frit sealing system bonding first and second substrates to each other using a frit, comprising: forming the frit on one of the first and second substrates; forming the second substrate on the first substrate; forming a thermal expansion film on the second substrate; and forming a mask on the thermal expansion film; applying heat to the second substrate and the thermal expansion film to harden the frit so that at least part of the thermal expansion film expands by the heat and pressurizes the second substrate.

In the above method, the second substrate is heated by radiation of a laser. In the above method, the radiation of the laser on the second substrate and the thermal expansion film comprises: first radiating a portion of the laser toward the second substrate to melt the frit; and second radiating another portion of the laser to expand the thermal expansion film around the frit. In the above method, the mask comprises a base formed of a transparent material and a metal layer formed on a surface of the base, and wherein the second radiating comprises heating the metal layer of the mask so that the heated metal layer expands the thermal expansion film. The above method further comprises pressurizing the mask to prevent the mask from moving when the thermal expansion film expands.

Another aspect is a frit sealing system for bonding first and second substrates to each other using a frit interposed between the substrates, the system comprising: a thermal expansion layer formed on the second substrate and configured to expand so as to pressurize the second substrate when heat is applied to the thermal expansion layer, the second substrate and the frit.

The above system further comprises a mask formed on the thermal expansion layer, wherein the mask is configured to receive and transfer the heat to the thermal expansion layer. In the above system, a plurality of openings are formed in the thermal expansion layer and wherein the openings are formed substantially directly above the frit.

DETAILED DESCRIPTION OF CERTAIN INVENTIVE EMBODIMENTS

Generally, an OLED apparatus includes a pair of electrodes, i.e., first and second electrodes, and at least one organic layer interposed between the two electrodes. The first electrode is formed on a first substrate and operates as an anode that injects holes, and the organic layers are formed on the first substrate. The second electrode is formed on the organic layers to be opposite to the first electrode and operates as a cathode that injects electrons.

If moisture or oxygen flows from the surrounding environment into the OLED electrodes are oxidized and peel, thereby reducing the lifespan of the OLED, lowering luminous efficiency, and changing light-emitting colors.

Accordingly, when the OLED is manufactured, sealing is generally performed to isolate the OLED from the environment and to prevent permeation of moisture into the OLED. In such a sealing method, organic polymer such as polyester (PET) or the like is laminated on a second electrode of the OLED, alternatively a cover or a cap is formed of a metal or glass including an absorbent. Then, the OLED is filled with a nitride gas, and an edge of the cover or cap is encapsulated using a sealing material such as epoxy.

However, this sealing method does not completely or substantially completely block undesirable materials such as moisture, oxygen, and the like that are permeated from the outside. The sealing method is not applied to an active top-emission OLED vulnerable to moisture, and a process of realizing the active top-emission OLED is complicated. In order to solve these problems, a capsule sealing method has been introduced to improve an adhesive strength between a device substrate and a cap using a frit as a sealing material.

The frit is coated on a glass substrate in order to completely seal a gap between the substrate and the cap, thereby further effectively protecting the OLED.

In the capsule sealing method using the frit, frit is coated on sealing parts of OLED, and a laser radiator moves to radiate a laser on the sealing parts of the OLED in order to harden the frit and seal the OLED apparatuses.

However, if only a laser is used to harden a frit in order to seal OLED, a short-term peeling problem and a long-term reliability problem occur. In more detail, a laser is radiated to melt a frit in order to locally apply heat without affecting the surroundings. Thus, since a temperature rises and then instantly drops, micro-cracks are formed in a brittle frit and frequently progress to peeling. Also, after the sealing process is performed, the micro-cracks coalesce and frequently progress to peeling in a long-term reliability test process.

Embodiments of the present invention will now be described in detail with reference to the attached drawings.

Figure 1:
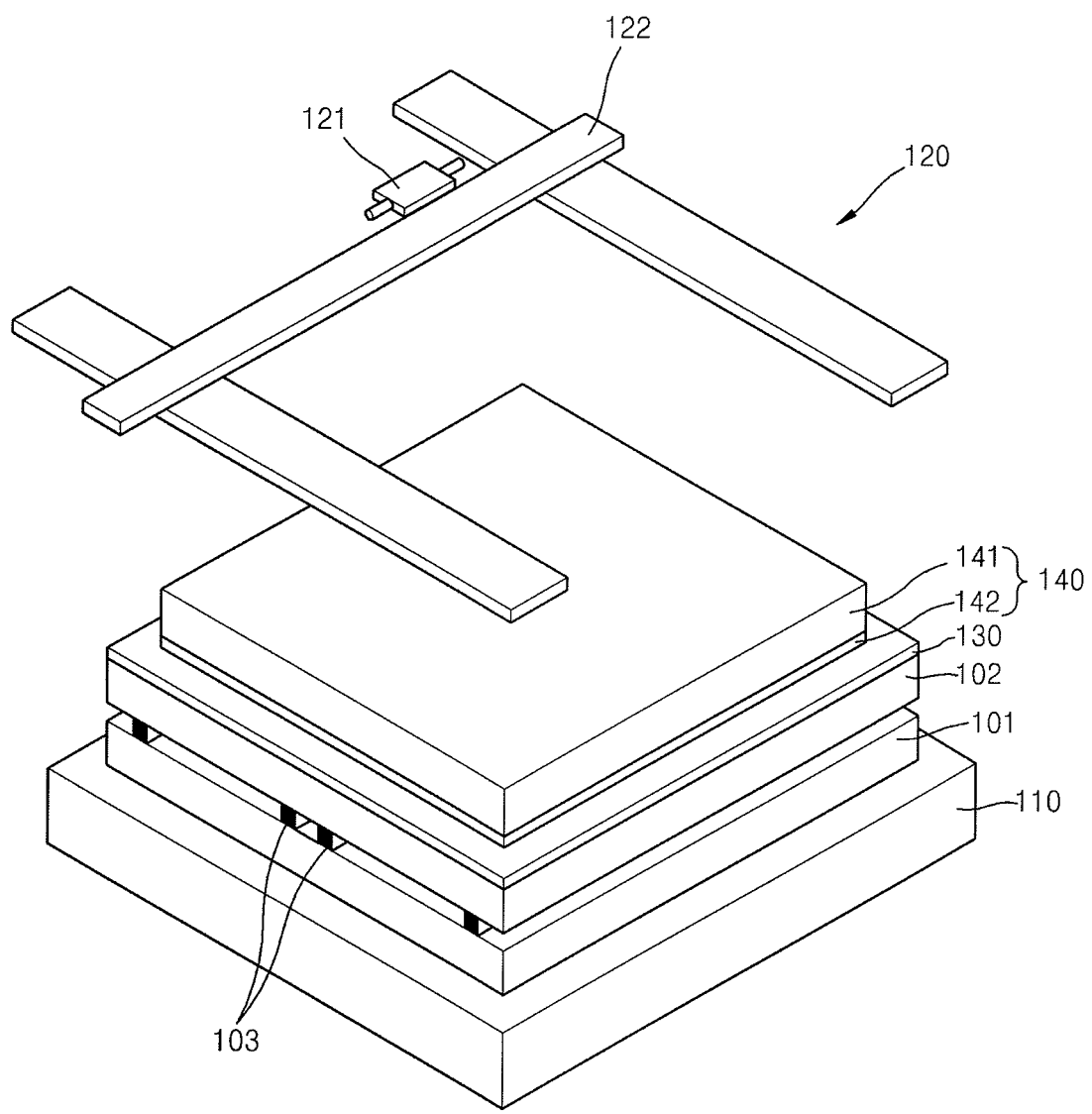
FIG. 1 is a schematic perspective view of a frit sealing system according to an embodiment of the present invention.
Figure 2:
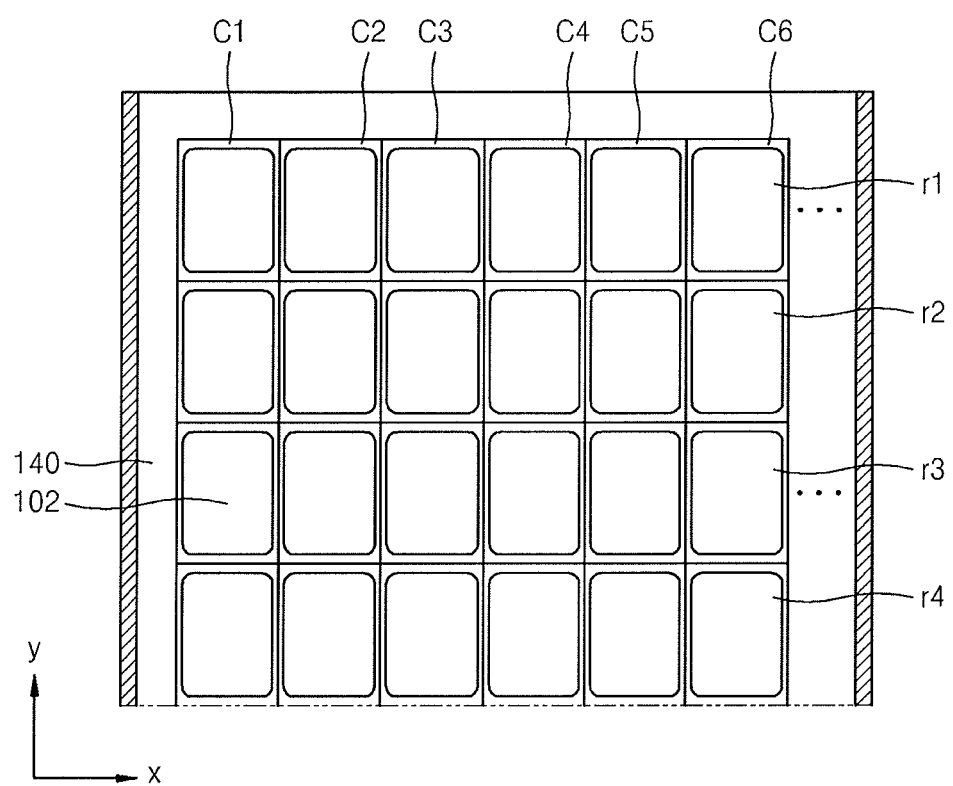
FIG. 2 is a plan view of the frit sealing system of FIG. 1.

FIG. 1 is a schematic perspective view of a frit sealing system according to an embodiment of the present invention. FIG. 2 is a plan view of the frit sealing system of FIG. 1, and FIG. 3 is a cross-sectional view of the frit sealing system of FIG. 1.

A frit generally indicates powdered glass, but a frit used in embodiments of the present invention refers to gel glass in which an organic material is added into powdered glass or solid glass hardened by a laser.

Figure 3:
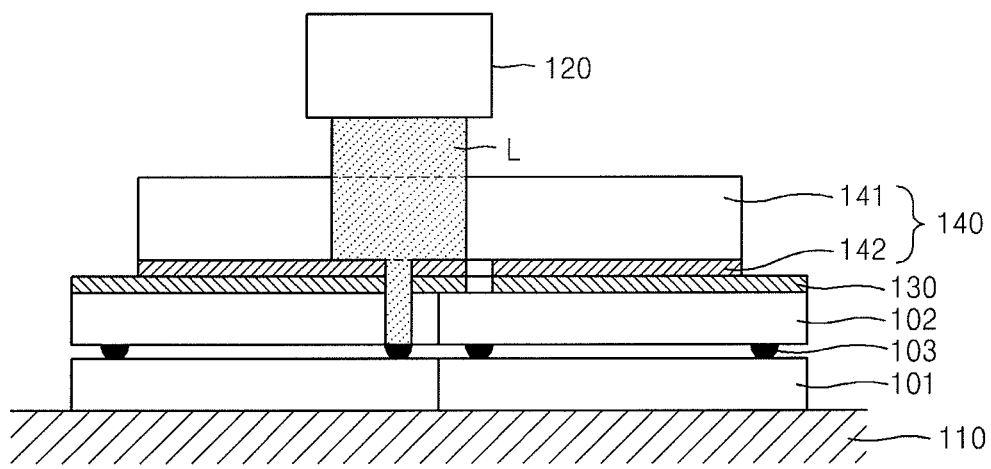
FIG. 3 is a cross-sectional view of the frit sealing system of FIG. 1.

Referring to FIGS. 1 through 3, the frit sealing system includes a bed 110, a laser radiator 120, a thermal expansion film (or thermal expansion layer) 130, and a mask 140.

First and second substrates 101 and 102 are disposed sequentially on the bed 110. A frit 103 is coated or formed between the first and second substrates 101 and 102.

The laser radiator 120 radiates a laser to the frit 103 coated between the first and second substrates 101 and 102 to melt the frit 103 to bond the first and second substrates 101 and 102 with the melted frit 103. Here, a laser head 121 is supported by a laser head guide 122 and installed to move above the first and second substrates 101 and 102. A heat or energy source other than a laser radiator 120 may be used to apply heat to at least one of the second substrate 102, the frit 103, the thermal expansion film 130 and the mask 140. For the convenience, the laser radiator 120 will be described.

The thermal expansion film 130 is disposed on the first and second substrates 101 and 102 on which the laser is radiated and which are bonded to each other. In one embodiment, only an area of the thermal expansion film 130 on which the laser is radiated expands in order to locally pressurize parts of the first and second substrates 101 and 102 around the bonded parts of the first and second substrates 101 and 102. The thermal expansion film 130 prevents the mask 140 from directly contacting the second substrate 102 in order to prevent the second substrate 102 from breaking and being damaged. The thermal expansion film 130 will be described in more detail later.

The mask 140 is disposed on the thermal expansion film 130 to substantially completely pressurize the first and second substrates 101 and 102. In one embodiment, the mask 140 is formed of a transparent material such as a glass material or the like. The transparent mask 140 allows the laser to transmit therethrough. Here, the mask 140 includes a base 141, which may be formed of a transparent material such as glass or the like, and a metal layer 142, which covers at least a portion of the base 141.

In one embodiment, the metal layer 142 is formed of a metal such as copper (Cu), aluminum (Al), or the like having high thermal conductivity on a lower surface of the base 141. In one embodiment, the metal layer 142 is not formed on a part on which the frit 103 is formed, i.e., on a movement path of the laser, so that the laser reaches the frit 103. In one embodiment, the metal layer 142 is deposited to a thickness of about 1.5 μm or more to prevent the metal layer 142 from being thermalized or warping due to the increase in temperature when the laser is blocked.

Referring to FIG. 2, the frit sealing system substantially simultaneously and/or sequentially bonds the first and second substrates 101 and 102 in one or more rows and one or more columns. In one embodiment, one mother substrate is bonded one time and cut into a plurality of organic light-emitting display (OLED) apparatuses Referring to FIG. 2, substrates in 4 rows "r1," "r2," "r3," and "r4" and substrates in 6 columns "c1," "c2," "c3," "c4," "c5," and "c6" are bonded to one another by the frit sealing system. In one embodiment, the laser radiator 120 moves along one direction, i.e., direction "x" of FIG. 2, and radiates the laser on the substrates in the one direction to sequentially bond the substrates to one another. For example, the laser radiator 120 moves along edges of the substrates in the row "r1" and the column "c1" to bond the substrates to one another. In one embodiment, the laser radiator 120 moves along the direction "x" to sequentially bond the substrates in the row "r1" and the column "c2", the row "r1" and the column "c3," the row "r1" and the column "c4", the row "r1" and the column "c5," and the row "r1" and the column "c6" and moves to the row "r2" to sequentially bonds the substrates in the row "r2."

If the laser radiator 120 includes a plurality of laser heads 121, the laser radiator 120 may skip the substrates in the direction "x" one-by-one to substantially simultaneously bond the substrates to one another. For example, if the laser radiator 120 includes three laser heads, the laser radiator 120 substantially simultaneously bonds the substrates in the row "r1" and the column "c1," the row "r1" and the column "c3," and the row "r1" and the column "c5" to one another and moves to the next column section along the direction "x" to substantially simultaneously bond the substrates in the row "r1" and the column "c2", the row "r1" and the column "c4," and the row "r1" and the column "c6" to one another.

The frit sealing system includes the thermal expansion film 130, which is formed between the first and second substrates 101 and 102 and the mask 140, to expand a local area of the thermal expansion film 130 on which the laser is radiated, in order to locally pressurize the parts around the bonded parts of the first and second substrates 101 and 102.

For example, in a structure for coating a glass substrate to seal an OLED apparatus, a gap between a device substrate and a cap is substantially completely sealed. Thus, the OLED apparatus is further effectively protected. A capsule sealing method using a frit as described above involves coating a frit on sealing parts of OLED apparatuses and moving a laser radiator to radiate a laser on the sealing parts of the OLED apparatuses in order to harden the frit and seal the OLED apparatuses. However, if only a laser is used to harden a frit and seal OLED apparatuses, a short-term peeling problem and a long-term reliability problem occur. In order to solve these problems, various general methods had been studied to mechanically pressurize a side of a substrate. However, in this case, the substrate is damaged when being pressurized.

In order to solve this problem, the thermal expansion film 130 is formed between the first and second substrates 101 and 102 and the mask 140 to expand the local area of the thermal expansion film 130 in order to pressurize the first and second substrates 101 and 102. As a result, the frit sealing system improves the adhesive strength of the frit and long-term reliability of cells.

In one embodiment, the thermal expansion film 130 is formed of a material having a relatively high thermal expansion coefficient on the second substrate 102.

All kinds of materials have thermal expansion coefficients as their own constants. A thermal expansion coefficient indicates how much a material expands when a temperature increases by about 1° C. A material having a high thermal expansion coefficient expands more than a material having a low thermal expansion coefficient when a temperature increases by about 1° C. In general, a thermal expansion coefficient of liquid is higher than that of solid, and materials such as polymer, elastomer, wood, and the like have higher thermal expansion coefficients than metals.

In one embodiment, the thermal expansion film 130 meets a few requirements. The thermal expansion film 130 has a sufficient heat resistance. Even though laser does not directly contact a thermal expansion film when sealing, a temperature of at least about 200° c or more is applied to fully expand the thermal expansion film 130 in order to pressurize a substrate. In one embodiment, the thermal expansion film 130 is formed of a material which endures a temperature of about 250° C. or more for several seconds. In one embodiment, the material of the thermal expansion film does not include moisture or the like because a material which emits moisture when a temperature increases highly becomes a problem in a sealing process.

The thermal expansion film 130 having a high thermal expansion coefficient and a high heat resistance as described above is formed on the second substrate 102. In one embodiment, the thermal expansion film 130 is formed of polymer, elastomer, or the like having a high thermal expansion coefficient.

An area of the thermal expansion film 130 is patterned such that the thermal expansion film 130 is not formed on a part on which the frit 103 is coated, i.e., on the movement path of the laser. The thermal expansion film 130 is patterned such that the thermal expansion film 130 is not formed on a radiation path of the laser in FIG. 3, but is not limited thereto. The thermal expansion film 130 may be formed on the whole surface of the second substrate 102. In this case, the thermal expansion film 130 is formed of a transparent material so that a laser "L" reaches the frit 103.

The mask 140 including the base 141 and the metal layer 142 is disposed on the thermal expansion film 130 of which area has been patterned.

When the laser "L" radiated from the laser radiator 120 passes through the mask 140, i.e., a portion of the laser "L" passes through an upper surface of the frit 103, where the portion of the laser "L" is absorbed into the frit 103 through the base 141 and the metal layer 142 of the mask 140 and the thermal expansion film 130. Thus, the portion of the laser "L" melts the frit 103 to bond the first and second substrates 101 and 102 to each other. Thermal energy blocked by the metal layer 142 of the mask 140 increases a temperature of the metal layer 142 of the mask 140. When the thermal energy is transmitted downward, the temperature of the thermal expansion film 130 having the high thermal expansion coefficient increases. Thus, the thermal expansion film 130 expands, thereby pressurizing the second substrate 102 on which the thermal expansion film 130 is positioned. In one embodiment, only an area around an area of the thermal expansion film 130 on which the laser is radiated, i.e., an area around the frit 103, expands, thereby pressurizing the second substrate 102.

Since the thermal expansion film 130 expands upward and downward, the thermal expansion film 130 applies a force in a direction for raising the mask 140. In one embodiment, a pressurizer or a pressurizing layer (not shown) is further formed to pressurize the mask 140 downward so that the thermal expansion film 130 does not raise the mask 140. In one embodiment, if the pressurizer is formed, the thermal expansion film 130 expands only in a direction for pressurizing the second substrate 102 downward without raising the mask 140.

Therefore, the frit sealing system, including the thermal expansion film 130, considerably improves a bonding quality. In addition, only the area of the thermal expansion film 130 next to the frit 103 may expand to pressurize the second substrate 102 so as to focus a pressure on the bonded part, thereby obtaining a high bonding quality. Moreover, the thermal expansion film 130 is interposed between the second substrate 102 and the mask 140 in order to prevent the second substrate 102 from being damaged due to direct contact with the mask 140.

Figure 4:
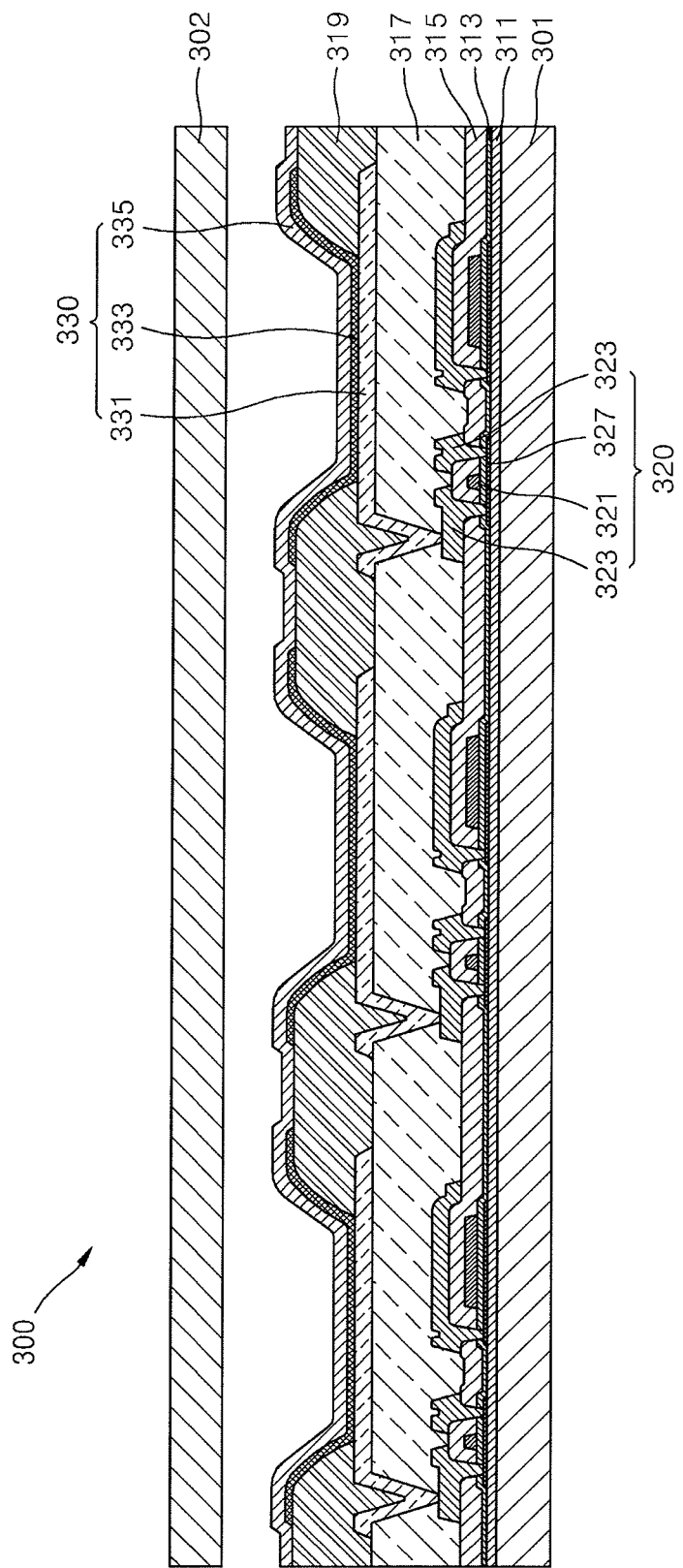
FIG. 4 is a schematic cross-sectional view of an organic light-emitting display (OLED) apparatus according to an embodiment of the present invention.

FIG. 4 is a schematic cross-sectional view of an OLED apparatus 300 manufactured by a frit sealing system according to an embodiment of the present invention.

Referring to FIG. 4, a plurality of thin film transistors (TFTs) 320 are disposed on a substrate 301, and an OLED 330 is formed on the TFTs 320. The OLED 330 includes a pixel electrode 331 which is electrically connected to the TFTs 320, a counter (or opposite) electrode 335 which is disposed above the whole surface of the substrate 301, and an intermediate layer 333 which is interposed between the pixel electrode 331 and the counter electrode 335 and has at least one light-emitting layer.

The TFTs 320 are formed on the substrate 301 and include gate electrodes 321, source and drain electrodes 323, semiconductor layers 327, gate insulating layers 313, and interlayer insulating layers 315. The TFTs 320 are not limited to the present embodiment of FIG. 4 and may be organic TFTs including the semiconductor layers 327 formed of an organic material, silicon TFTs including the semiconductor layers 327 formed of silicon, or the like. In one embodiment, a buffer layer 311 is further formed of silicon oxide or silicon nitride between the TFTs 320 and the substrate 301.

The OLED 330 includes the pixel electrode 331 and the counter electrode 335 which are opposite to each other, and the intermediate layer 333 which is interposed between the pixel and counter electrodes 331 and 335. The intermediate layer 333 includes a plurality of layers including at least one light-emitting layer. These light-emitting layers will be described in detail later.

In one embodiment, the pixel electrode 331 operates as an anode electrode, and the counter electrode 335 operates as a cathode electrode. In another embodiment, the pixel electrode 331 operates as a cathode electrode, and the counter electrode 335 operates as an anode electrode.

In one embodiment, the pixel electrode 331 is a transparent electrode or a reflective electrode. If the pixel electrode 331 is a transparent electrode, the pixel electrode 331 may be formed of ITO, IZO, ZnO, or $In_2O_3$. Otherwise, if the pixel electrode 331 is a reflective electrode, the pixel electrode 331 may include a reflective layer formed of, for example, Ag, Mg, Al, Pt, Pd, Au, Ni, Nd, Ir, Cr, or a compound of Ag, Mg, Al, Pt, Pd, Au, Ni, Nd, Ir, and Cr and a layer formed of ITO, IZO, ZnO, or $In_2O_3$ on the reflective layer.

In one embodiment, the counter electrode 335 is also a transparent electrode or a reflective electrode. If the counter electrode 335 is a transparent electrode, the counter electrode 335 may include i) a layer which is formed of, for example, Li, Ca, LiF/Ca, LiF/Al, Al, Mg, or a compound of Li, Ca, LiF/Ca, LiF/Al, Al, and Mg to face the intermediate layer 333 between the pixel and the counter electrodes 331 and 335, and ii) an auxiliary electrode or a bus electrode line which is formed of a transparent electrode material such as ITO, IZO, ZnO, or $In_2O_3$ on the layer. Otherwise, if the counter electrode 335 is a reflective electrode, the counter electrode 335 is formed of Li, Ca, LiF/Ca, LiF/Al, Al, Mg, or a compound of Li, Ca, LiF/Ca, LiF/Al, Al, and Mg.

In one embodiment, a pixel-defining layer (PDL) 319 covers ends of the pixel electrode 331 and has a thickness that increases toward the edge of the pixel electrode 331. The PDL 319 defines a light-emitting area and widens a gap between the end of the pixel electrode 331 and the counter electrode 335 in order to prevent an electric field from focusing on the ends of the pixel electrode 331. Thus, the PDL 319 prevents the pixel electrode 331 and the counter electrode 335 from short-circuiting.

In one embodiment, one of various types of intermediate layers 333 including at least one light-emitting layer is formed between the pixel electrode 331 and the counter electrode 335. The at least one light-emitting layer of the intermediate layer 333 may be formed of a low molecular weight organic material or a polymer organic material.

In one embodiment, if the intermediate layer 333 is formed of a low molecular weight organic material, i) a hole injection layer (HIL), ii) a hole transport layer (HTL), iii) an emission layer (EML), iv) an electron transport layer (ETL), v) an electron injection layer (EIL), and the like are stacked in a single or complex structure in order to form the intermediate layer 333. Copper phthalocyanine (CuPc), N,N'-Di(naphthalene-1-yl)-N,N'-diphenyl-benzidine (NPB), and tris-8-hydroxyquinoline aluminum (Alq3) may be used as low molecular weight organic materials. These low molecular weight organic materials may be formed using a method such as a vacuum deposition method or the like using masks.

In one embodiment, if the intermediate layer 333 is formed of the polymer organic material, the intermediate layer 333 includes an HTL and an EML. Here, the HTL may be formed of poly(3,4-ethylenedioxythiophene) (PEDOT), and the EML may be formed of a polymer organic material such as Poly-Phenylenevinylene (PPV), Polyfluorene, or the like.

The OLED 330 is electrically connected to the TFTs 320. Here, if a planarizing layer 317 is formed to cover the TFTs 320, the OLED 330 is disposed on the planarizing layer 317, and the pixel electrode 331 of the OLED 330 is electrically connected to the TFTs 320 through contact holes formed in the planarizing layer 317.

The OLED 330 formed on the substrate 301 is sealed by a sealing substrate 302. The sealing substrate 302 is formed of one of various types of materials including glass, plastic, and the like.

According to at least one embodiment, in a frit sealing system and a method of manufacturing an OLED apparatus using the frit sealing system, an adhesive strength of a frit is improved, without damaging the substrate. Thus, the long-term reliability of cells is improved.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light emitting display apparatus using a frit sealing system bonding first and second substrates to each other using a frit, comprising:
   forming the frit on one of the first and second substrates;
   forming the second substrate on the first substrate;
   forming a thermal expansion film on the second substrate; and
   forming a mask on the thermal expansion film;
   applying heat to the second substrate and the thermal expansion film to harden the frit so that at least part of the thermal expansion film expands by the heat and pressurizes the second substrate.

2. The method of claim 1, wherein the second substrate is heated by radiation of a laser.

3. The method of claim 2, wherein the radiation of the laser on the second substrate and the thermal expansion film comprises:
   first radiating a portion of the laser toward the second substrate to melt the frit; and
   second radiating another portion of the laser to expand the thermal expansion film around the frit.

4. The method of claim 3, wherein the mask comprises a base formed of a transparent material and a metal layer formed on a surface of the base, and wherein the second radiating comprises heating the metal layer of the mask so that the heated metal layer expands the thermal expansion film.

5. The method of claim 2, further comprising pressurizing the mask to prevent the mask from moving when the thermal expansion film expands.

* * * * *